United States Patent
Han et al.

(10) Patent No.: US 7,001,529 B2
(45) Date of Patent: Feb. 21, 2006

(54) PRE-ENDPOINT TECHNIQUES IN PHOTORESIST ETCHING

(75) Inventors: Taejoon Han, Pleasanton, CA (US); Xiaoqiang Yao, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 137 days.

(21) Appl. No.: 10/400,404

(22) Filed: Mar. 27, 2003

(65) Prior Publication Data

US 2004/0074867 A1 Apr. 22, 2004

Related U.S. Application Data

(60) Provisional application No. 60/419,806, filed on Oct. 18, 2002.

(51) Int. Cl.
*H01L 21/00* (2006.01)
(52) U.S. Cl. ............ 216/59; 216/60; 216/67; 438/725; 430/313
(58) Field of Classification Search ........... 216/59, 216/60, 67; 438/725; 430/313
See application file for complete search history.

(56) References Cited

U.S. PATENT DOCUMENTS

| | | | | |
|---|---|---|---|---|
| 5,516,729 A | * | 5/1996 | Dawson et al. | 438/623 |
| 5,565,114 A | * | 10/1996 | Saito et al. | 216/60 |
| 6,638,853 B1 | * | 10/2003 | Sue et al. | 438/633 |
| 6,764,810 B1 | * | 7/2004 | Ma et al. | 430/313 |

* cited by examiner

*Primary Examiner*—Shamim Ahmed
(74) *Attorney, Agent, or Firm*—IP Strategy Group, PC (57) ABSTRACT

A method for controlling a photoresist etch step in a plasma processing chamber is disclosed. The photoresist etch step being configured to etch back a photoresist layer deposited on a substrate surface to a thinner photoresist layer having predefined photoresist thickness. The method includes etching the photoresist layer using a plasma etch process and detecting interference patterns coming from the photoresist layer. The method further includes terminating the photoresist etch step when an analysis of the interference patterns indicates that the predefined photoresist thickness is achieved, whereby the predefined photoresist thickness is greater than zero.

25 Claims, 10 Drawing Sheets

PRE-ENDPOINT TECHNIQUES IN PHOTORESIST ETCHING

CROSS-REFERENCE TO RELATED APPLICATIONS

This application claims priority from U.S. Provisional Application No. 60/419,806 entitled "Novel Approach For PR EB Process Throughout Improvement And Utilization Of UV Reflection As Pre-Endpoint Scheme Of Bulk PR Etching Step" by inventors Taejoon Han and Xiaoquiang Yao (filed Oct. 18, 2002), which is incorporated herein by reference.

BACKGROUND OF THE INVENTION

The invention relates generally to methods for monitoring and controlling processes employed in substrate processing. More specifically, the invention relates to techniques for controlling photoresist etching in the fabrication of integrated circuit devices.

The processing of a semiconductor substrate (such as a wafer or a glass panel) often involves the etching of the overlaying photoresist layer. For example, in a process known as dual damascene, it is desirable to etch back the photoresist layer prior to a given trench etch. To facilitate understanding, the dual damascene process will be employed as an example throughout this disclosure. It should be kept in mind, however, that the invention herein applies to any process in which control of the photoresist etch step is desired.

Generally speaking, dual-damascene integration may be used to form high-speed wiring interconnects in complex integrated circuit devices. In dual-damascene integration, trenches and vias are formed in a low-permittivity (low-κ) dielectric, such as a fluorosilicate glass (FSG), an organosilicate glass (OSG), e.g., BLACK DIAMOND or CORAL, or a spin-on organic (SOG), e.g., SILK or FLARE, and filled with a low-resistance metal, usually copper. The copper is used to reduce the resistance of the metal interconnects, and the low-κ dielectric is used to reduce the parasitic capacitance between the metal interconnects.

Figure 1A:
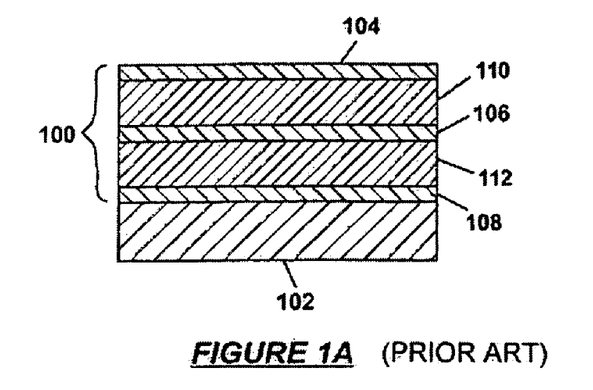
FIG. 1A shows a dual-damascene stack prior to forming a trench and via.

A via-first dual-damascene process sequence is illustrated in FIGS. 1A–1F. In FIG. 1A, a dual-damascene stack 100 is formed on a copper line 102. In general, a dual damascene stack is made of a sequence of hard masks and interlayer dielectrics. For example, the dual damascene stack 100 includes a top hard mask 104, an embedded hard mask 106, and a bottom hard mask 108. The dual damascene stack 100 also includes low-κ interlayer dielectrics 110, 112. The top hard mask 104 protects the interlayer dielectric 110 from chemicals used in photoresist stripping and may be omitted depending on the low-κ material used in the interlayer dielectric 110. The embedded hard mask 106 may act as an etch stop layer. The bottom hard mask 108 prevents the copper 102 from diffusing into the interlayer dielectric 112.

Figure 1B:
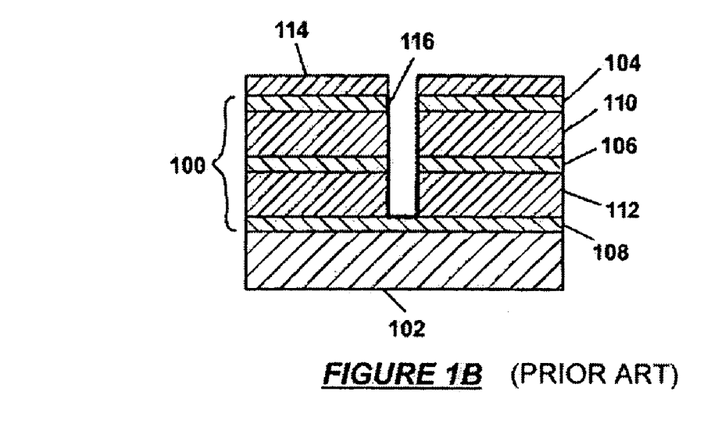
FIG. 1B shows a via formed in the dual-damascene stack of FIG. 1A.
Figure 1C:
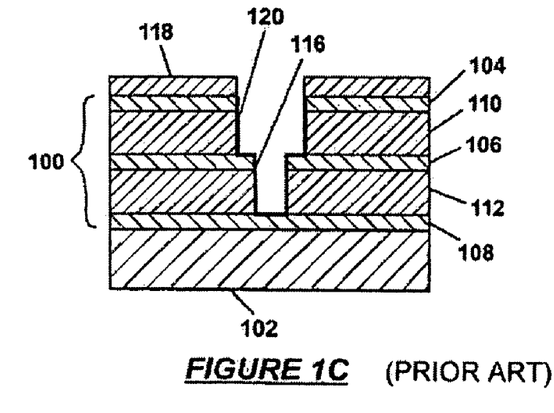
FIG. 1C shows a trench formed in the dual-damascene stack of FIG. 1B.
Figure 1D:
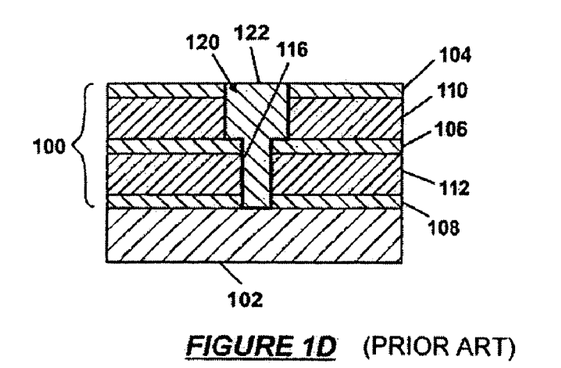
FIG. 1D shows the via and trench of FIG. 1C filled with copper.

In FIG. 1B, a photoresist mask 114 having a via pattern is applied on the stack 100. A via 116 is formed in the stack 100 by etching the via mask 114 through the top hard mask 104, the interlayer dielectric 110, the embedded hard mask 106, and the interlayer dielectric 112, stopping on the bottom hard mask 108. In FIG. 1C, the photoresist mask (114 in FIG. 1B) is stripped off and replaced with a photoresist mask 118 having a trench pattern. A trench 120 is formed in the stack 100 by etching the trench mask 118 through the top hard mask 104 and the interlayer dielectric 110, stopping on the embedded hard mask 106. In FIG. 1D, the trench mask (118 in FIG. 1C) is stripped off, and copper 122 is deposited into the via 116 and trench 120 and polished back to the surface of the trench 120. The via 116 and trench 120 are typically lined with a material such as tantalum to prevent copper from diffusing into the interlayer dielectrics 110, 112.

Figure 1E:
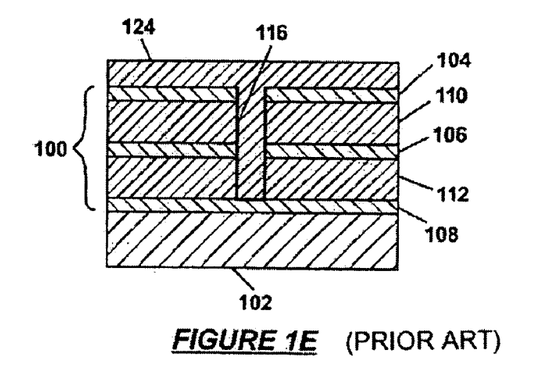
FIG. 1E shows a via blanket-filled with a photoresist material.

Prior to etching the trench 120, a plug is formed in the via 116 to protect the via 116 and the bottom hard mask 108 during etching of the trench 120 and to control the trench etch profile. Typically, the plug is made of a photoresist. The plug is formed by depositing a photoresist inside the via 116 and on the top hard mask 104 and etching back the photoresist. FIG. 1E shows photoresist 124 deposited inside the via 116 and on the top hard mask 104. Currently, a two-stage process is used for the photoresist etch back. In the first stage, a bulk etch process is used to planarize the blanket of photoresist 124 on the top hard mask 104. All of the photoresist 124 on the top hard mask 104 may be removed by the bulk etch process. More preferably, only a portion of the photoresist 124 on top of hard mask 104 is removed by the bulk etch process, down to a desired photoresist thickness before the recess etch step in the second stage.

Figure 1F:
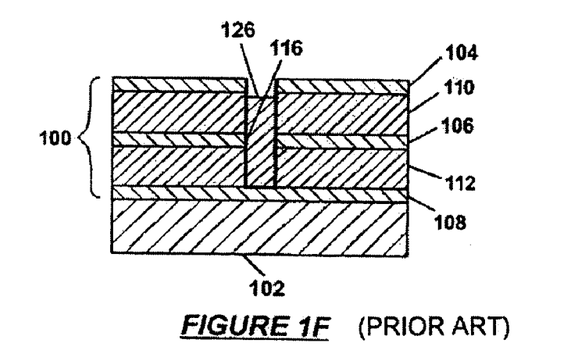
FIG. 1F shows a plug formed in the via shown in FIG. 1E.

In the second stage, a recess etch process is used to reduce the height of the column of photoresist 124 in the via 116 to form a plug having a specified height. FIG. 1F shows a plug 126 formed in the via 116 by performing the photoresist etch back.

Typically, the bulk etch is performed using by timed etch. Depending on the incoming thickness variation of the photoresist 124 from one wafer to another, the thickness of photoresist 124 remaining on the top hard mask 104 after the bulk etch process is terminated may vary substantially. Consequently, the total recess etch time may also vary substantially.

In comparison to the bulk etch process, the recess etch process is a slower process. Generally speaking, the recess etch is end-pointed using OES, and there may be an over-etch of, for example, 10 seconds to ensure that the photoresist clears. The slower process is required for better control of etching inside the via 116.

In general, the thicker the amount of photoresist 124 remaining on the stack 100, the longer the total recess etch time, resulting to decreased throughput. Using a timed etch process, there is also the possibility of the bulk etch front moving inside the via 116. This is undesirable because the bulk etch process is fast and aggressive and difficult to control inside the via 116.

From the foregoing, there is desired a method of controlling the photoresist etch back process such that total recess etch time is minimized regardless of incoming material variations. There is also desired a method of ensuring that the bulk etch front does not move inside the via.

SUMMARY OF THE INVENTION

The invention relates, in one embodiment, to a method method for controlling a photoresist etch step in a plasma processing chamber, the photoresist etch step being configured to etch back a photoresist layer deposited on a substrate surface to a thinner photoresist layer having predefined photoresist thickness. The method includes etching the photoresist layer using a plasma etch process and detecting interference patterns coming from the photoresist layer. The method further includes terminating the photoresist etch step when an analysis of the interference patterns indicates that the predefined photoresist thickness is achieved, whereby the predefined photoresist thickness is greater than zero.

In another embodiment, the invention relates to a method for etching a photoresist layer in a plasma processing chamber, the photoresist layer being disposed on a substrate. The method includes performing a first photoresist etch step for etching the photoresist layer using a first plasma etch recipe, the first photoresist etch step being configured to etch the photoresist layer down to a thinner photoresist layer having a predefined photoresist thickness. The performance of the first photoresist etch step includes detecting interference patterns coming from the photoresist layer during the first photoresist etch step and terminating the first photoresist etch step when an analysis of the interference patterns indicates that the predefined photoresist thickness is achieved, whereby the predefined photoresist thickness is greater than zero. The method further includes performing a second photoresist etch step for etching the thinner photoresist layer using a second plasma etch recipe different from the first etch recipe.

In yet another embodiment, the invention relates to a method for etching a photoresist layer in a plasma processing chamber, the photoresist layer being disposed on an underlying layer having at least a via disposed therein, photoresist material of the photoresist layer being present above a surface of the underlying layer and inside the via. The method includes performing a bulk etch step for etching the photoresist layer using a first plasma etch recipe, the bulk etch step being configured to etch the photoresist layer down to a thinner photoresist layer having a predefined photoresist thickness.

The performance of the bulk etch step includes detecting interference patterns coming from the photoresist layer during the bulk etch step and terminating the bulk etch step when an analysis of the interference patterns indicates that the predefined photoresist thickness is achieved, whereby the predefined photoresist thickness is greater than zero. The method additionally includes performing a recess etch step for etching the thinner photoresist layer using a second plasma etch recipe different from the first etch recipe, an etch rate of the bulk etch step being faster than an etch rate of the recess etch step, the recess etch step being configured to etch only a portion of the photoresist material disposed in the via, thereby leaving a column of photoresist material remaining in the via after the recess etch step.

BRIEF DESCRIPTION OF THE DRAWINGS

The invention is illustrated by way of example, and not by way of limitation, in the figures accompanying the drawings, and in which like reference numerals refer to similar elements, and in which.

DETAILED DESCRIPTION OF THE PREFERRED EMBODIMENTS

The invention will now be described in detail with reference to a few preferred embodiments, as illustrated in the accompanying drawings. In the following description, numerous specific details are set forth in order to provide a thorough understanding of the invention. It will be apparent, however, to one skilled in the art, that the invention may be practiced without some or all of these specific details. In other instances, well-known process steps and/or features have not been described in detail in order to not unnecessarily obscure the invention. The features and advantages of the invention may be better understood with reference to the drawings and discussions that follow.

While not wishing to be bound by theory, it is believed by the inventors herein that when varying amounts of photoresist remain on a thin-film stack, such as a dual-damascene stack, after bulk etch, the total recess etch time required to form a via plug of a specified height in the thin-film stack also varies, and this affects throughput. Also, there is the possibility of the bulk etch front moving into the via. This is undesirable because bulk etch is fast and aggressive and does not have the required selectivity to etch controllably inside the via. Thus, the inventors propose herein a pre-endpoint scheme whereby a specified thickness of photoresist remains on the stack after bulk etch, regardless of the incoming thickness of the photoresist. In this way, the total recess etch time is constant from wafer to wafer, and the possibility of the bulk etch front moving into the via is eliminated. The overall etch-back time is reduced by making the remaining photoresist on the stack as thin as possible using the faster bulk etch.

Figure 2A:
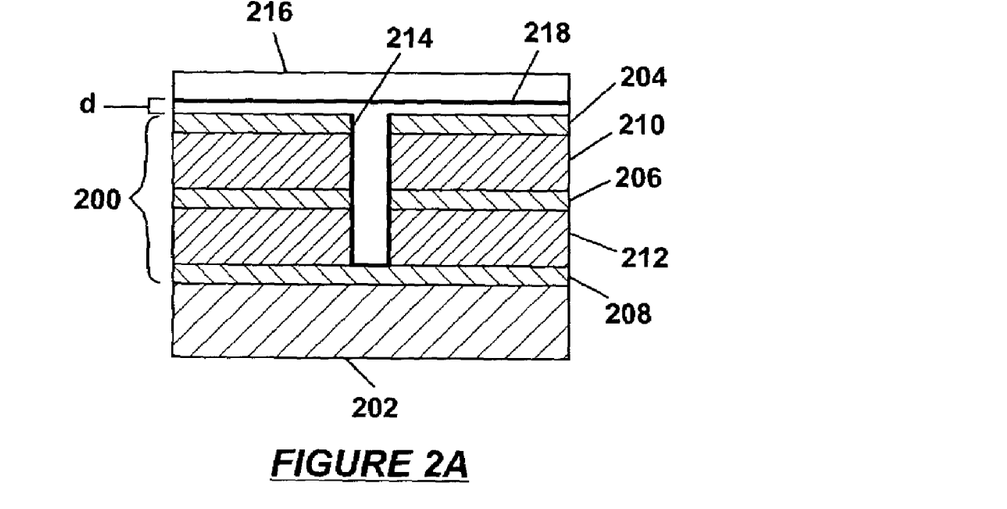
FIG. 2A is a transverse cross-section of a thin-film stack and a pre-endpoint according to an embodiment of the invention.

To facilitate discussion of the invention, FIG. 2A shows a thin-film stack 200 formed on a metal layer 202. For illustration purposes, the thin-film stack 200 is assumed to be a dual-damascene stack, and the metal layer 202 is assumed to be copper. However, as will become obvious from the discussion below, the invention is not limited to any particular thin-film configuration or metal layer. The thin-film stack 200 includes a top hard mask 204, an embedded hard mask 206, and a bottom hard mask 208. Typically, the hard masks 204, 206, 208 are made of silicon nitride (SiNx). Other exemplary materials for the hard masks 204, 206, 208 include, but are not limited to, silicon oxynitride (SiON), silicon carbide (SiC), and silica (SiO2). Usually, the choice of hard mask material will depend on the expected function of the hard mask.

The thin-film stack 200 also includes low-κ interlayer dielectrics 210, 212 made of a low-κ material, such as a fluorosilicate glass (FSG), an organosilicate glass (OSG), or a spin-on organic (SOG). Examples of OSGs include, but are not limited to, BLACK DIAMOND from Applied Materials and CORAL from Novellus with a SiOxCyHz composition. Examples of SOGs include, but are not limited to, SILK from Dow Chemical and FLARE. FSGs are fluorine-doped silica glasses. One function of the top hard mask 204 is to protect the interlayer dielectric 210 from chemicals used in photoresist stripping and may be omitted depending on the low-κ material used in the interlayer dielectric 210. The top hard mask 204 typically also acts as a planarization stop layer. The embedded hard mask 206 typically acts as an etch stop layer. One function of the bottom hard mask 208 is to prevent the copper 202 from diffusing into the interlayer dielectric 212.

A via (or hole) 214 is etched in the thin-film stack 200. The via 214 extends from the top of the top hard mask 204, through the interlayer dielectric 210, embedded hard mask 206, and interlayer dielectric 212, and stops on the bottom hard mask 208. Photoresist 216 is deposited on the top hard mask 204 and inside the via 214. A photoresist etch back process can be used to form a plug of a desired height inside the via 214. Typically, the photoresist etch back process is performed in two stages. The first stage is a bulk etch process, wherein the blanket of photoresist 216 on the top hard mask 204 is planarized. The second stage is a recess etch process, wherein the column of photoresist 216 inside the via 214 is reduced to a desired height. In accordance with one embodiment of the invention, one goal is to ensure that a certain thickness (d) of photoresist 216, demarcated by line 218, remains on top of the stack 200 after the bulk etch, regardless of the original thickness of the photoresist 216. The thickness d could be 1000 Å, for example, or other value. Typically, the smaller the value of the thickness d, the less time is required for the recess etch, and the lower the overall etch-back time.

Figure 2B:
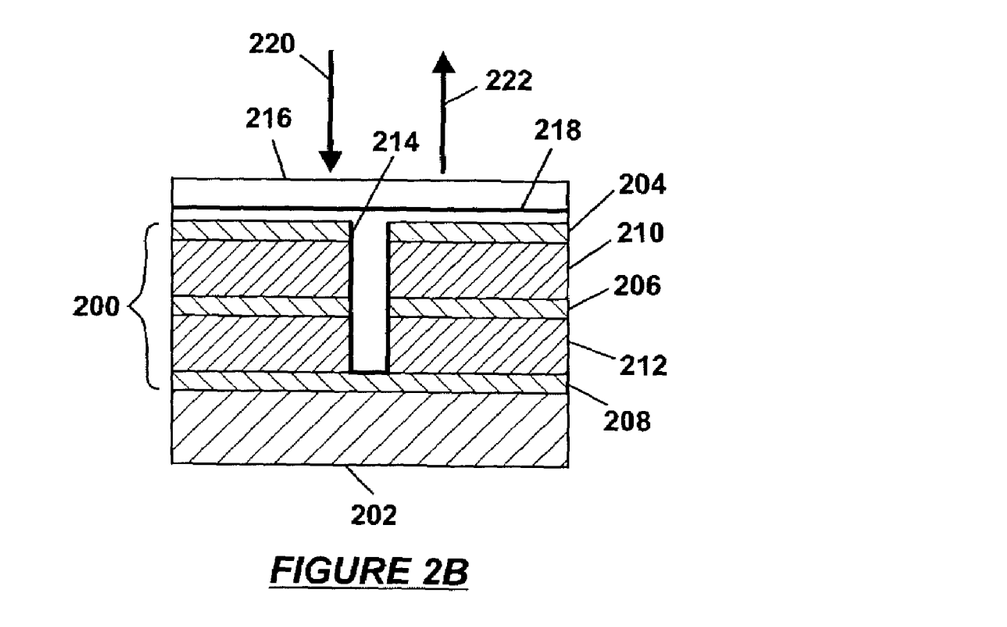
FIG. 2B illustrates a scheme for finding the pre-endpoint indicated in FIG. 2A.

The endpoint of the bulk etch will be referred to herein as pre-endpoint because the entire blanket of photoresist 216 on the top hard mask 204 is not removed. In other words, the blanket of photoresist 216 is etched back to a thinner photoresist layer having a photoresist thickness greater than zero after the bulk etch step. In one embodiment, detection of the pre-endpoint is based on reflectance measurements during the bulk etch. Referring to FIG. 2B, the pre-endpoint scheme involves illuminating the surface of the photoresist 216 with a light beam 220 and measuring the intensity of a light beam 222 reflected from the photoresist layer (which may include light reflection through the photoresist layer off one or more layers underlying the photoresist layer). The light beams 220, 222 are shown normal to the photoresist 216. However, this does not mean that the invention is limited to normal-incidence reflectance measurements. The light beam 220 could strike the photoresist 216 at an angle, for example, and the light beam 222 could be reflected from the photoresist 216 at an angle.

Typically, at the beginning of the bulk etch, the photoresist 216 is too thick to allow the light beam 220 to pass through. However, as the thickness of the photoresist 216 is reduced, there will be a certain point at which the light beam 220 begins to pass through the photoresist 216. At this point, the intensity of the light beam reflected from the wafer photoresist 216 starts to change. The interference patterns in the reflected light coming from the photoresist layer 216 (which may include reflected components from layers underlying the photoresist layer) are then analyzed. The interferometric approach involves counting the number of fringes evolved from the photoresist 216 as the photoresist is etched. The wavelength or wavelength range of the light, the refractive indices of the photoresist and the layer(s) underlying the photoresist determine the frequency of the fringes, and these can be correlated with the remaining photoresist thickness. Once the interference patterns detected correlates with the desired photoresist thickness, a pre-endpoint signal is generated and the bulk etch is terminated.

Figure 3:
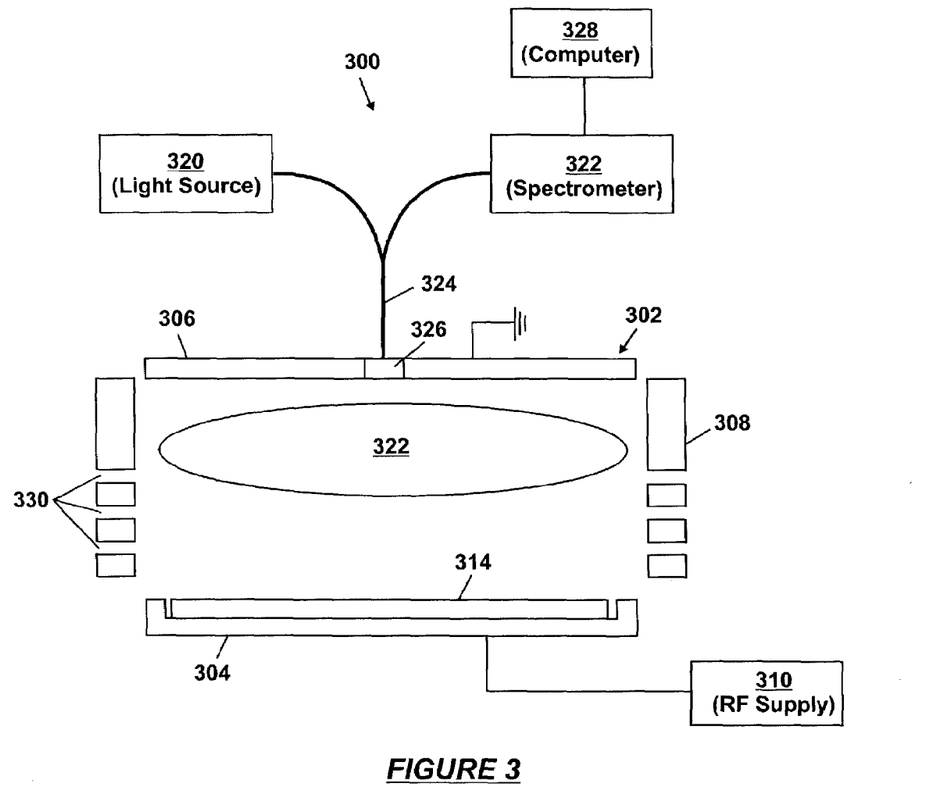
FIG. 3 is a simplified schematic of a system for conducting photoresist etch-back according to an embodiment of the invention.

FIG. 3 is a simplified schematic of a system 300 for conducting photoresist etch-back according to an embodiment of the invention. The system 300 includes a reaction chamber 302 having two substantially parallel electrodes 304, 306 and a confinement ring assembly 308. The electrode 304 is energized by a RF supply 310, and the electrode 306 is grounded. A wafer 314 is mounted on the electrode 304. For illustration purposes, it is assumed that a thin-film stack, such as a dual-damascene stack, is formed on the wafer 314. It is assumed further that a via has been etched in the thin-film stack and that photoresist has been deposited on top of the thin-film stack and inside the via. It is assumed further that the photoresist is to be etched back for the purpose of forming a plug inside the via.

For in-situ monitoring of the wafer 314, the system further includes a light source 320 for illuminating the wafer 314, a spectrometer 322 for detecting and analyzing light reflected from the wafer 314, and a bifurcated fiber 324 for transporting light to and from a port 326 in the electrode 306. The bifurcated fiber 324 is connected to the light source 320 and the spectrometer 322. The spectrometer 322 sends data representative of the reflectance spectrum of the wafer 314 to a computer 328 for further analysis. In one embodiment, the light source 320 is a UV light source capable of generating light in a wavelength range of, for example, 200 to 400 nm. Alternatively, the light source 320 could be one capable of generating light in the infrared or visible spectral range. In general, the operating wavelength, or wavelength range, is selected such that sensitivity is heightened. In general, the operating wavelength should be at least twice the desired thickness at which the pre-endpoint signal is generated. In another embodiment, the light source 320 may be eliminated and plasma emissions generated above the wafer 314 may be used as the illumination source.

Figure 4:
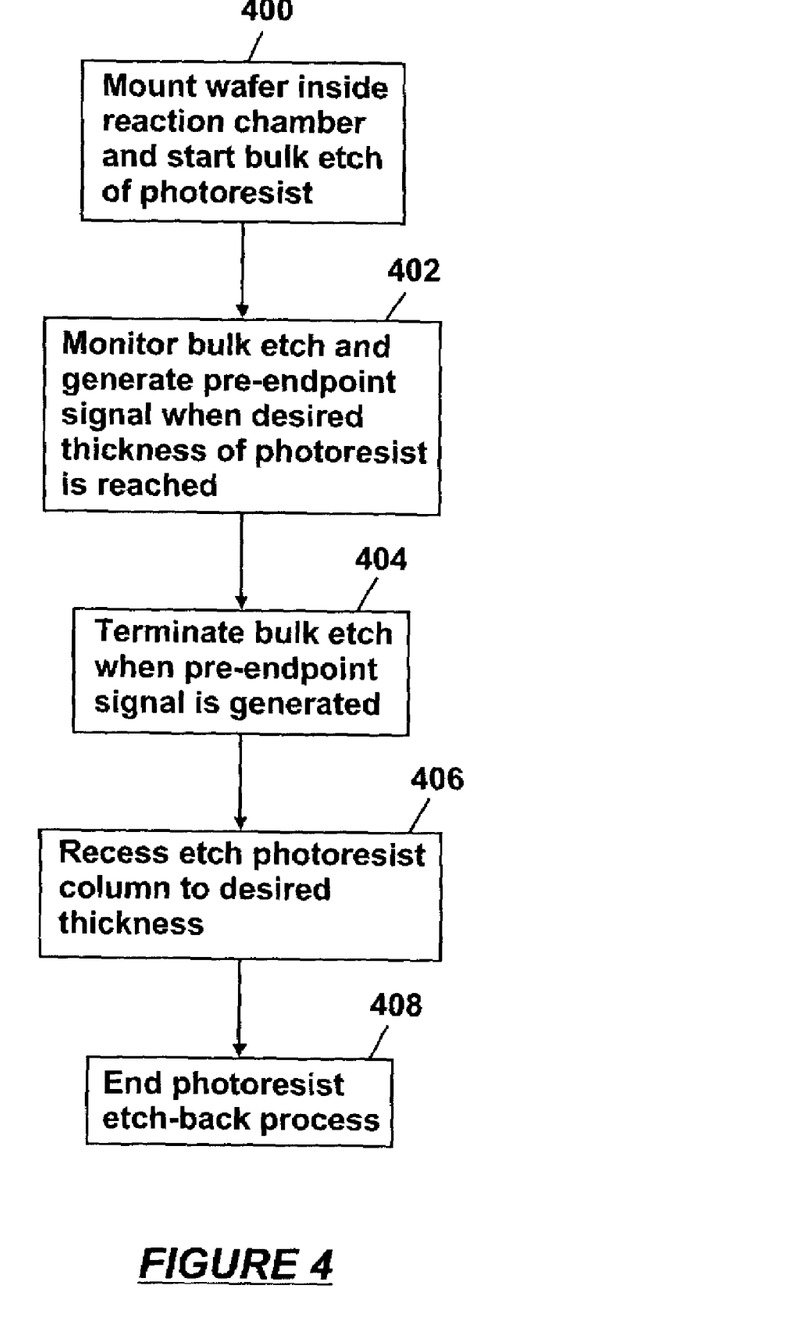
FIG. 4 is an overview of a process for performing photoresist etch-back according to an embodiment of the invention.

FIG. 4 is an overview of a process for performing photoresist etch-back according to an embodiment of the invention. At the start of the process, the wafer (314 in FIG. 3) is mounted inside the reaction chamber (302 in FIG. 3) and bulk etch is started (400). In one embodiment, the bulk etch process includes supplying appropriate etchant gases into the reaction chamber through ports (330 in FIG. 3) in the confinement ring assembly (308 in FIG. 3). To achieve a fast bulk etch rate, the etchant gases are supplied at a relatively high pressure, e.g., 550 MT. The etchant gases are charged by the electrodes (304, 306 in FIG. 3) to form a plasma (332 in FIG. 3), e.g., an oxygen plasma, above the wafer. The plasma is used to bulk-etch the photoresist at the top of a thin-film stack on the wafer. During bulk-etch of the photoresist, the wafer is monitored to determine when the photoresist has been etched to the desired thickness. When the desired thickness is reached, a pre-endpoint signal is generated (402), and the bulk-etch process is terminated (404).

To generate the pre-endpoint signal, the reflected light from the wafer (314 in FIG. 3) is monitored during the bulk etch process. This is done by illuminating the wafer and collecting the light reflected from the wafer. At the start of the bulk etch, light typically cannot pass through the photoresist because the photoresist is too thick. Thus, the intensity of the light reflected from the wafer will be very high. As the photoresist is etched back, there will come a point when the light striking the photoresist will be able to pass through the photoresist. At this point, a change in the intensity of the light reflected from the wafer will be detected. When this change is detected, counting of the fringes evolved from the wafer starts. The thickness of the photoresist when the change in intensity is detected is known. Therefore, the number of fringes required to reach the desired thickness can be calculated. When the predetermined number of fringes required to reach the desired thickness has been calculated, the bulk etch process is terminated.

After the bulk etch process is terminated, the pressure at which the etchant gases are supplied into the reaction chamber (302 in FIG. 3) is lowered to, for example, 530 MT. Then, a recess etch process is started (406). The recess etch process is used to etch a column of photoresist in the via in the thin-film stack on the wafer (314 in FIG. 3) to a desired height. The recess etch may be a timed etch based on the amount of photoresist to be removed. The amount of photoresist to be removed is known because the starting depth of the recess etch, i.e., the amount of photoresist remaining on the top of the thin-film stack is known. The etch-back process is terminated after the recess etch is complete (408).

Figure 5A:
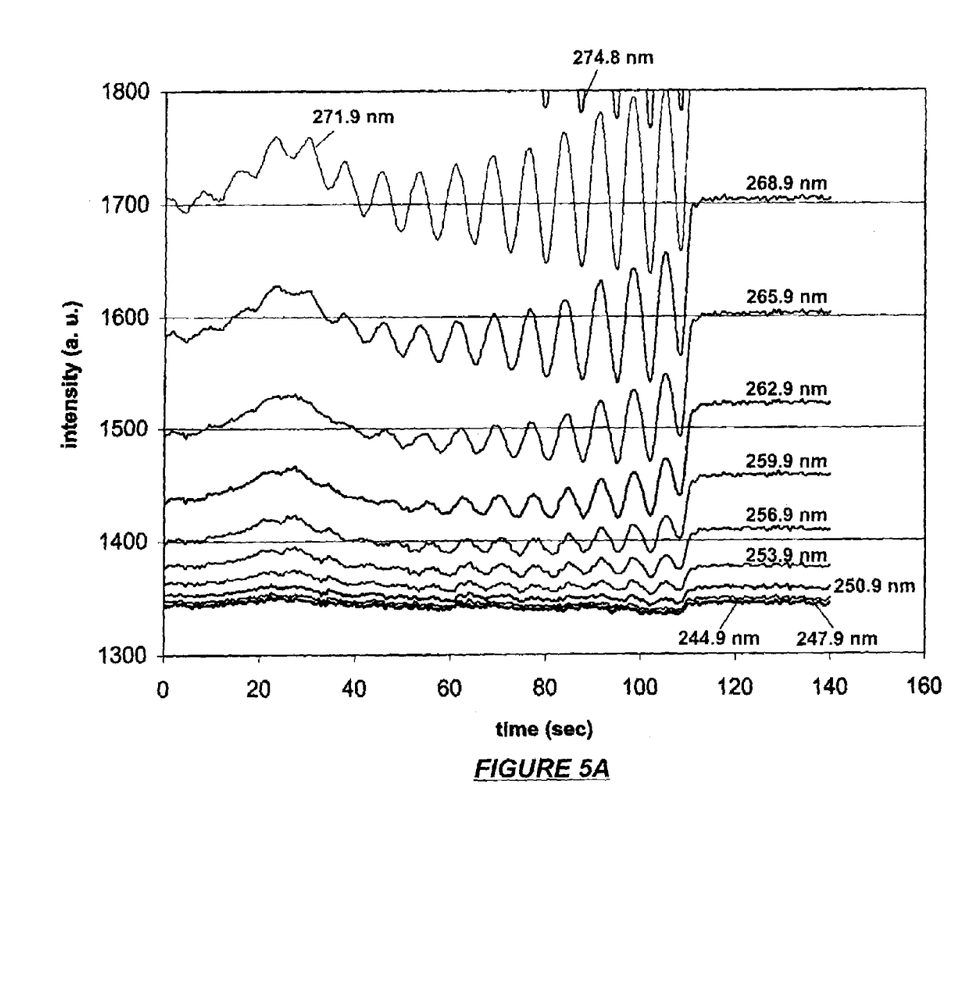
FIG. 5A shows intensity profiles at various wavelengths for a deep-UV photoresist applied on a bare silicon wafer.
Figure 5B:
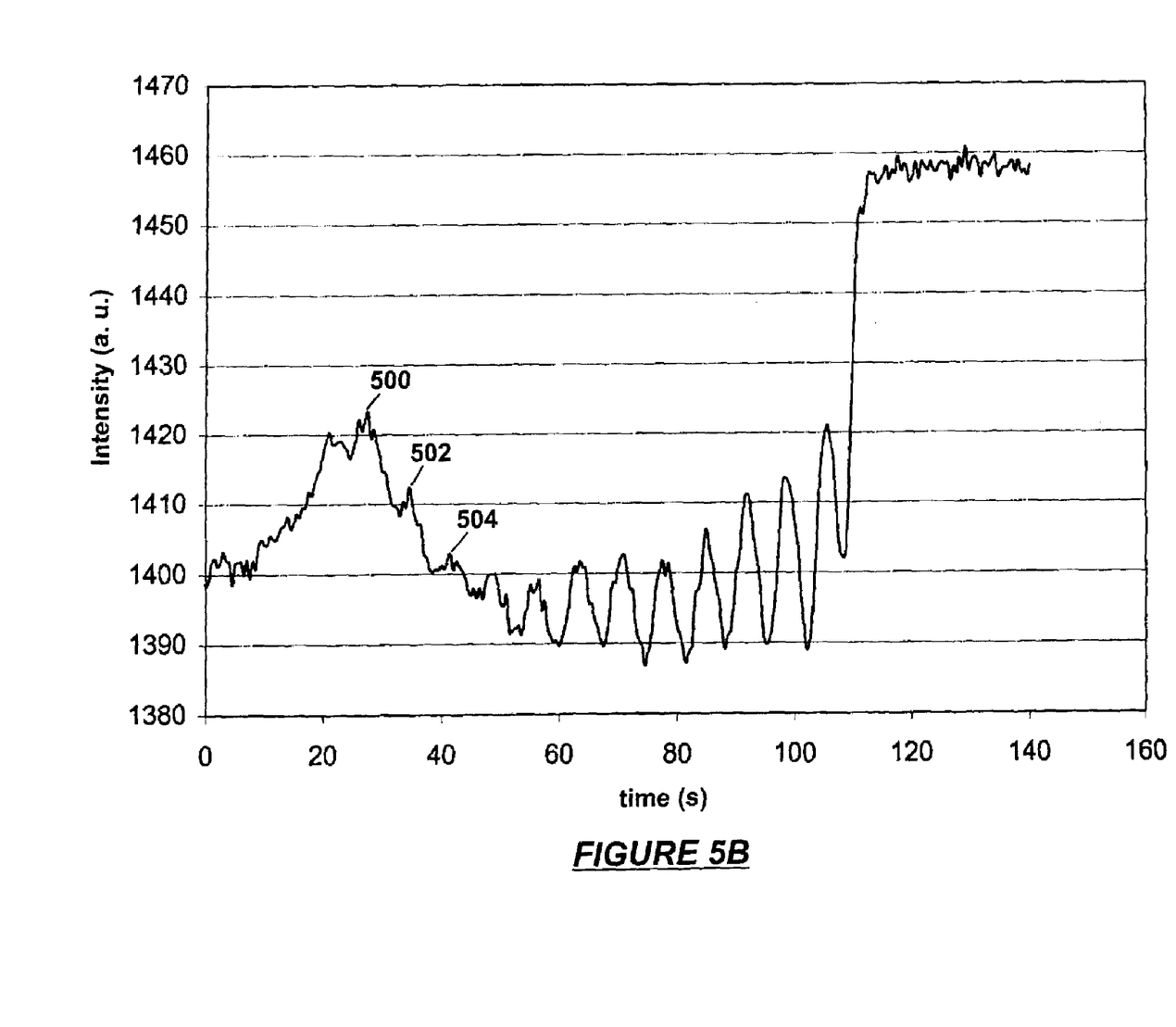
FIG. 5B shows one of the intensity profiles of FIG. 5A at a wavelength of 259.9 nm.

For illustration purposes, FIG. 5A shows a plot of intensity of light reflected from a deep-UV photoresist as a function of time at various wavelengths using plasma emissions as the illumination source. The data are actually for a case where the photoresist is applied on top of a bare silicon wafer, as opposed to the top of a thin-film stack. In general, the intensity profiles when the photoresist is applied on the top of a thin-film stack are expected to be similar to the ones shown in FIG. 5A. An inspection of the intensity profiles shows that sensitivity is maximum at a wavelength of 259.9 nm. FIG. 5B shows an enlargement of the intensity profile at the wavelength of 259.9 nm. The intensity profile has many small peaks (or noise), such as indicated at 500, 502, 504, which may be construed as fringes. Therefore, it is important to reduce or eliminate these small peaks (or noise) before counting the fringes.

Figure 5C:
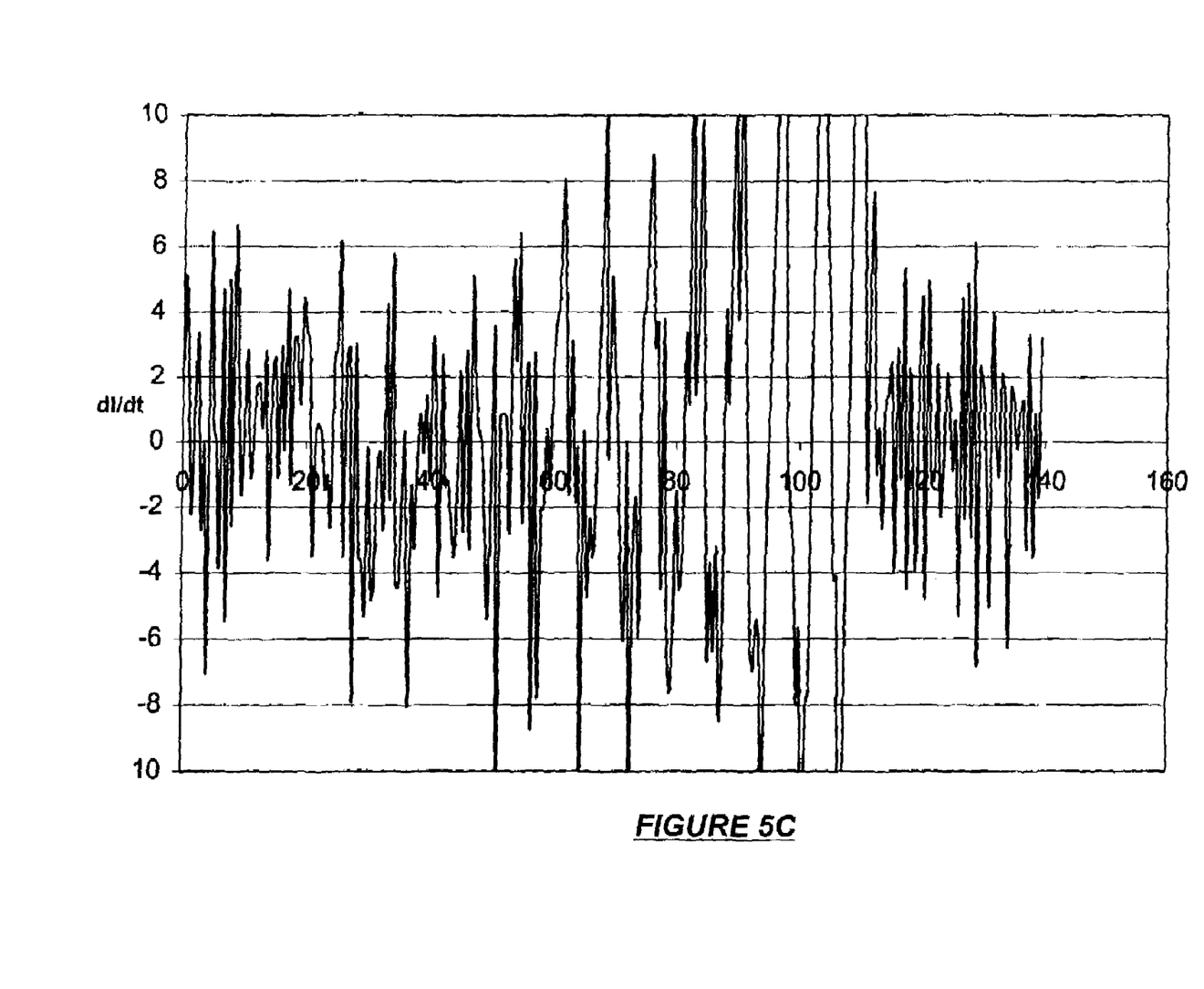
FIG. 5C shows a time-derivative of the intensity profile shown in FIG. 5B at time=0.5 s.
Figure 5D:
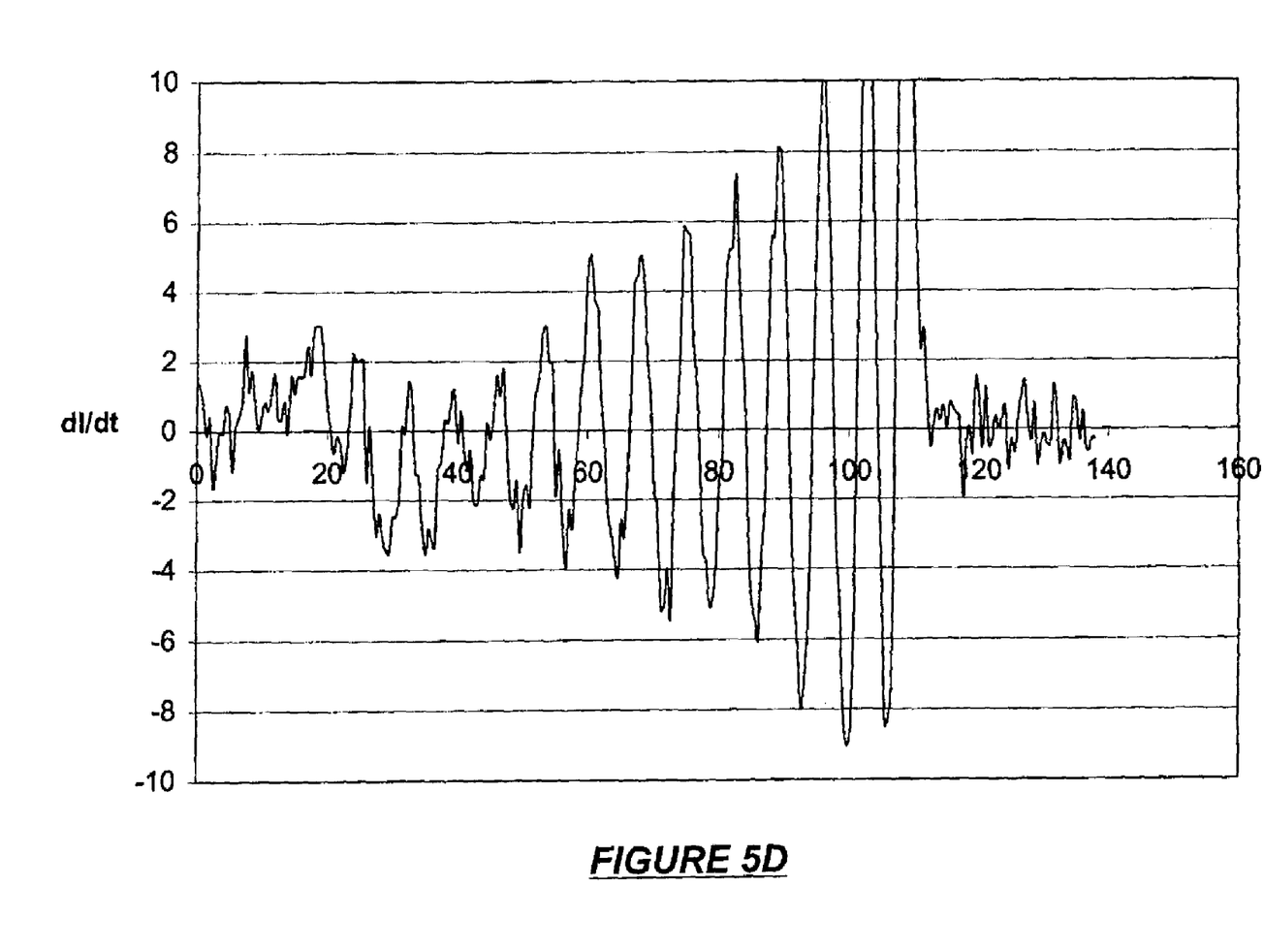
FIG. 5D shows a time-derivative of the intensity profile shown in FIG. 5B at time=2 s.
Figure 5E:
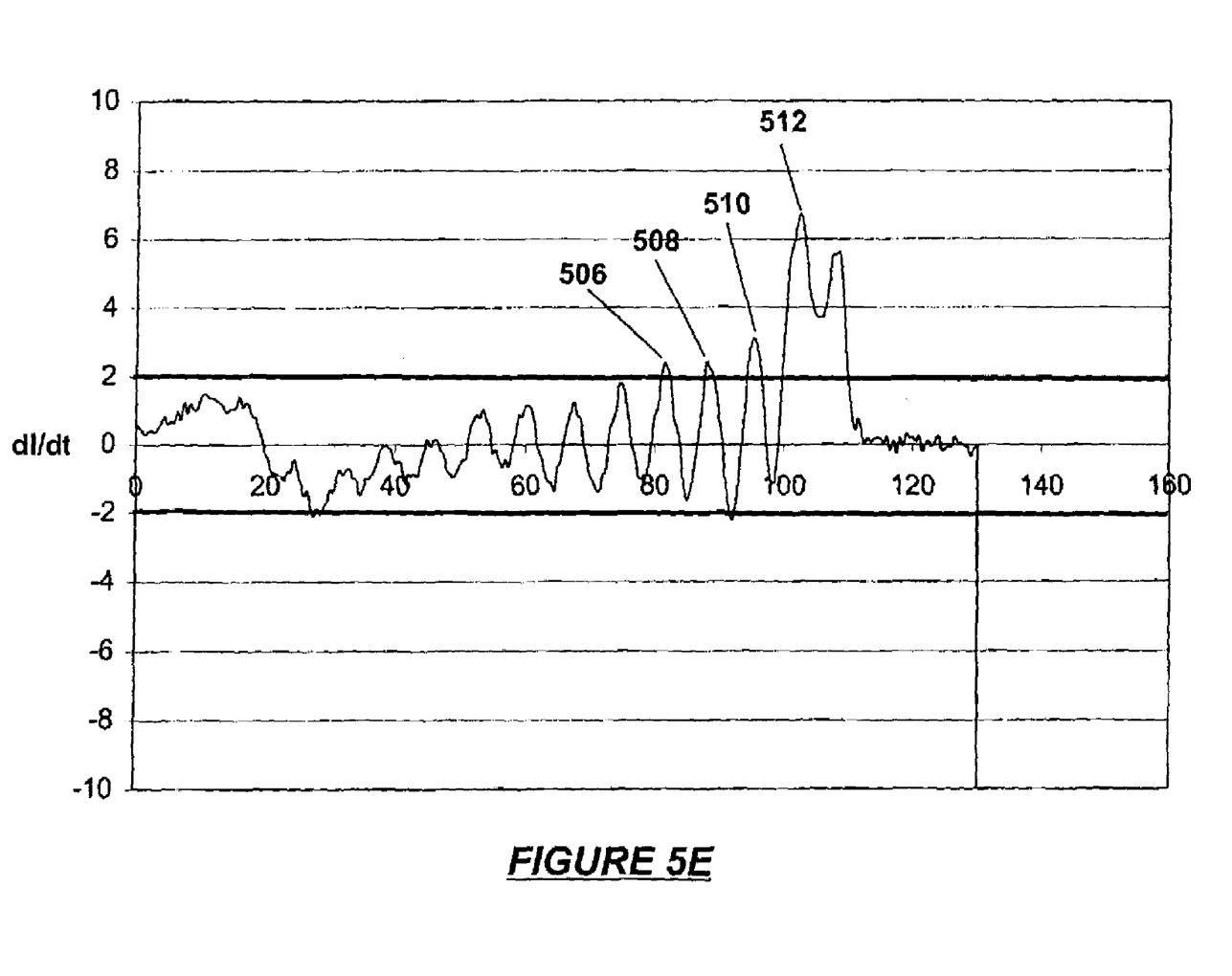
FIG. 5E shows a time-derivative of the intensity profile shown in FIG. 5B at time=10 s.

One technique for reducing noise involves taking a derivative of intensity with respect to time, i.e., dI/dt. FIG. 5C shows dI/dt profile at t=0.5 s. Note that the dI/dt profile at t=0.5 s is still very noisy. FIG. 5D shows dI/dt profile at t=2 s. Now, the dI/dt profile is not quite as noisy, but the fringes are still relatively difficult to count. FIG. 5E shows dI/dt profile at t=10 s. This dI/dt profile is much smoother than the ones obtained at 0.5 s and 2 s. In general, the dI/dt profile becomes smoother as the time at which the derivatives are taken increases. Next, a range of derivatives is selected and the fringes having peaks falling outside of this are counted. For the example shown in FIG. 5E, the fringes having peaks above +2 or below −2 are counted. These fringes are labeled as 506, 508, 510, and 512. The fringe count is compared to empirical data to determine how much photoresist has been removed.

The invention provides one or more advantages. Using the pre-endpoint scheme of the invention, a desired thickness of photoresist can remain on the thin-film stack after a bulk etch regardless of incoming material variations. Having the thickness of photoresist remaining on the thin-film stack constant over multiple wafers ensures that the total recess etch time also remains constant over the multiple wafers. The time required for recess etching can be minimized by making the thickness of photoresist remaining after bulk-etching as small as possible. Minimizing the recess etch time reduces the overall etch-back time and increases throughput. The pre-endpoint scheme also eliminates the possibility of the bulk etch front reaching the via and increases yield.

While the invention has been described in terms of several preferred embodiments, there are alterations, permutations, and equivalents which fall within the scope of this invention. For example, although the invention is discussed in the context of one specific dual damascene process, one skilled in the art would be able to readily adapt the teachings herein to control the etching of the photoresist layer in other dual damascene processes and indeed in any process (even those not involving dual-damascening) where the etching back of the photoresist layer is desired. It is therefore intended that the following appended claims be interpreted as including all such alterations, permutations, and equivalents as fall within the true spirit and scope of the invention.

What is claimed is:

1. In a plasma processing chamber, a method for controlling a photoresist etch step, said photoresist etch step being configured to etch back a photoresist layer deposited on an underlying layer of a substrate surface to a thinner photoresist layer having predefined photoresist thickness above an interface between said photoresist layer and said underlying layer, said method comprising:

etching said photoresist layer using a plasma etch process;

detecting interference patterns coming from said photoresist layer; and terminating said photoresist etch step when an analysis of said interference patterns indicates that said predefined photoresist thickness is achieved, whereby said predefined photoresist thickness is greater than zero.

2. The method of claim 1, wherein said photoresist etch step is a bulk photoresist etch in a dual damascene process.

3. The method of claim 1 further comprising illuminating said substrate with a light source.

4. The method of claim 3 wherein said light source is other than plasma emission present during said etching.

5. The method of claim 1 wherein said interference patterns comprises reflected plasma emission reflecting from said photoresist layer.

6. The method of claim 1, wherein said interference patterns result from UV illumination of said substrate.

7. The method of claim 6 wherein said underlying layer represents a hard mask layer.

8. The method of claim 7 wherein said hard mask layer comprises silicon nitride ($SiN_x$).

9. The method of claim 8 wherein said hard mask layer is disposed above a low-K dielectric layer.

10. The method of claim 7 further comprising illuminating said substrate with a light source having a wavelength from about 200 nm to about 400 nm.

11. In a plasma processing chamber, a method for etching a photoresist layer, said photoresist layer being disposed on an underlying layer of a substrate, comprising:

performing a first photoresist etch step for etching said photoresist layer using a first plasma etch recipe, said first photoresist etch step being configured to etch said photoresist layer down to a thinner photoresist layer having a predefined photoresist thickness above an interface between said photoresist layer and said underlying layer, said performing said first photoresist etch step includes detecting interference patterns coming from said photoresist layer during said first photoresist etch step and terminating said first photoresist etch step when an analysis of said interference patterns indicates that said predefined photoresist thickness is achieved, whereby said predefined photoresist thickness is greater than zero; and thereafter performing a second photoresist etch step for etching said thinner photoresist layer using a second plasma etch recipe different from said first etch recipe.

12. The method of claim 11, wherein said first photoresist etch step is a bulk photoresist etch in a dual damascene process.

13. The method of claim 11 further comprising illuminating said substrate with a light source.

14. The method of claim 13 wherein said light source is other than plasma emission present during said first photoresist etch step.

15. The method of claim 11 wherein said interference patterns comprises reflected plasma emission reflecting from said substrate.

16. The method of claim 11, wherein said interference patterns result from UV illumination of said substrate.

17. The method of claim 16 wherein said underlying layer represents a hard mask layer.

18. The method of claim 17 wherein said hard mask layer comprises silicon nitride ($SiN_x$).

19. The method of claim 11 wherein an etch rate of said first photoresist etch step is faster than an etch rate of said second photoresist etch step.

20. In a plasma processing chamber, a method for etching a photoresist layer, said photoresist layer being disposed on an underlying layer having at least a via disposed therein, photoresist material of said photoresist layer being present above a surface of said underlying layer and inside said via, comprising:

performing a bulk etch step for etching said photoresist layer using a first plasma etch recipe, said bulk etch step being configured to etch said photoresist layer down to a thinner photoresist layer having a predefined photoresist thickness, said performing said bulk etch step includes detecting interference patterns coming from said photoresist layer during said bulk etch step and terminating said bulk etch step when an analysis of said interference patterns indicates that said predefined photoresist thickness is achieved, whereby said predefined photoresist thickness is greater than zero; and thereafter performing a recess etch step for etching said thinner photoresist layer using a second plasma etch recipe different from said first etch recipe, an etch rate of said bulk etch step being faster than an etch rate of said recess etch step, said recess etch step being configured to etch only a portion of said photoresist material disposed in said via, thereby leaving a column of photoresist material remaining in said via after said recess etch step.

21. The method of claim 20 further comprising illuminating said substrate with UV light having a wavelength from about 200 nm to about 400 nm.

22. The method of claim 21 wherein said light source is other than plasma emission present during said bulk etch step.

23. The method of claim 20 wherein said interference patterns comprises reflected plasma emission reflecting from said photoresist layer.

24. The method of claim 20 wherein said underlying layer is a hard mask layer.

25. The method of claim 24 wherein said hard mask layer comprises silicon nitride ($SiN_x$).

\* \* \* \* \*